(12) United States Patent
Ikeda

(10) Patent No.: US 6,946,789 B2
(45) Date of Patent: Sep. 20, 2005

(54) EL SHEET WITH BENT LEG CONNECTORS

(75) Inventor: Hidetsugu Ikeda, Narashino (JP)

(73) Assignee: Seiko Precision Inc., Chiba-ken (JP)

( * ) Notice: Subject to any disclaimer, the term of this patent is extended or adjusted under 35 U.S.C. 154(b) by 0 days.

(21) Appl. No.: 10/370,977

(22) Filed: Feb. 20, 2003

(65) Prior Publication Data

US 2003/0168967 A1 Sep. 11, 2003

(30) Foreign Application Priority Data

Feb. 28, 2002 (JP) ........................................ 2002-053637

(51) Int. Cl.[7] .............................. H01J 1/62; H01J 63/04
(52) U.S. Cl. ........................ 313/500; 313/498; 313/505; 313/506
(58) Field of Search ................................ 313/498, 500, 313/505, 506, 512; 345/76; 315/169.1, 169.2, 169.3

(56) References Cited

U.S. PATENT DOCUMENTS

| | | | | |
|---|---|---|---|---|
| 3,631,285 A | * | 12/1971 | Laisi et al. ................. | 313/506 |
| 5,266,865 A | * | 11/1993 | Haizumi et al. ............. | 313/506 |
| 5,670,994 A | * | 9/1997 | Kawaguchi et al. ......... | 345/206 |
| 6,426,594 B1 | * | 7/2002 | Ito ........................... | 315/169.1 |
| 6,426,595 B1 | * | 7/2002 | Odake et al. ............. | 315/169.1 |

* cited by examiner

Primary Examiner—Joseph Williams
Assistant Examiner—Kevin Quarterman
(74) Attorney, Agent, or Firm—Jordan and Hamburg LLP

(57) ABSTRACT

A lead electrode unit for an EL element includes a lead electrode structure for a transparent electrode layer and a lead electrode structure for a back electrode layer. The EL element has a light-emitting layer, an insulating layer and the back electrode layer formed in that order on a transparent electrode layer on the transparent substrate. The uppermost face of the EL sheet structure is coated with a protective layer. A lead electrode runs from the transparent electrode layer. A lead electrode layer runs from the back electrode layer. An electrode plate is bonded to the lead electrode via an electroconductive adhesive. A connector is fitted to the electrode plate. The connector is bent to form its legs, and the legs run through the electrode plate. The end of each leg is folded to thereby fix the connector.

5 Claims, 3 Drawing Sheets

EL SHEET WITH BENT LEG CONNECTORS

BACKGROUND OF THE INVENTION

The present invention relates to an EL sheet for information appliances and others which may be used in high-temperature environments and in which lead electrodes of the EL sheet may receive great force while in use.

One example of conventional EL sheets comprises a transparent substrate of polyethylene terephthalate (hereinafter referred to as "PET") with a transparent electrode layer of indium tin oxide (hereinafter referred to as "ITO") formed thereon, and this is cut into a tabular structure with lead electrodes protruding from it. On the ITO layer of this tabular structure, formed is an EL element that comprises multiple layers mentioned below. A phosphor-containing light-emitting layer, an insulating layer, a back electrode layer and a protective layer are printed on the ITO layer. A lead electrode running from the transparent electrode layer is electrically connected to the ITO layer. On the other hand, a lead electrode running from the back electrode layer is formed as follows: A resist layer is formed on the ITO layer, and the lead electrode for the back electrode layer is formed while the back electrode layer is printed on the ITO layer. In case where the lead electrodes are electrode plates of metal, an electroconductive adhesive is printed on every lead electrode, and an electrode plate of metal is put on each lead electrode via the adhesive therebetween, and is thermally fixed to it under pressure. In another example of conventional EL sheets, a metal chip to be an electrode is kept in contact with every lead electrode, and the lead electrodes are sealed up along with the EL element by covering them with a protective layer while the tip of each metal chip is made to protrude outside, and thereafter the protruding tip of each metal chip is folded to complete the individual electrode plates.

The first example of the prior-art technique mentioned above is problematic in that its electric reliability is low. For example, when the ambient temperature around it is 80° C. or higher or when some strong external force is given to the lead electrodes, the bonding parts will peel to cause electric connection failure. The second example mentioned above is also problematic since the contact between the lead electrodes and the electrode chips is unstable and the contact pressure between them is difficult to keep all the time constant. In addition, the material of the transparent substrate, PET will be deformed by creeping, and it could not be stably contacted with electrode chips when exposed to temperature change or when given repeated stress, and further, the contact area may rust to cause electric connection failure.

SUMMARY OF THE INVENTION

Present invention provides an EL sheet in which the electric reliability of the lead electrodes is improved and which is therefore usable even in high-temperature conditions or under strong external force.

The EL sheet of the invention EL element that has a transparent electrode layer and a back electrode layer, and a connector is fixed to a lead electrode running from the transparent electrode layer and another connector is to a lead electrode running from the back electrode layer, both via an electroconductive adhesive put therebetween. Legs of each connector are formed by bending it and run through the individual lead electrode and their ends are folded to fix the connector. In this, the connectors are fixed not only with an electroconductive adhesive but also mechanically by folding their legs. Therefore, the lead electrodes withstand exposure to high temperatures and strong external force.

In its another aspect, the EL sheet has an EL element that has a transparent electrode layer and a back electrode layer, and an electrode plate is fixed to a lead electrode running from the transparent electrode layer and another electrode plate is to a lead electrode running from the back electrode layer, both via an electroconductive adhesive put therebetween. Connectors are put on the respective electrode plates and the legs of each connector are formed by bending it and run through the individual electrode plate and their ends are folded to fix the connector. The electrode plates are thereby kept in contact with the respective connectors, and the legs of every connector are folded and mechanically fixed. Therefore, the electric reliability of the lead electrodes is high, and the lead electrodes withstand exposure to high temperatures and strong external force.

In its still another aspect, the EL sheet EL element that has a transparent electrode layer and a back electrode layer, and an electrode plate is fixed to a lead electrode running from the transparent electrode layer and another electrode plate is to a lead electrode running from the back electrode layer both via an electroconductive adhesive put therebetween. Connectors are put on the respective electrode plates so as to have the respective lead electrodes between them and the legs of each connector are formed by bending it and run through the individual electrode plate and their ends are folded to thereby electrically connect and fix the connectors to the respective electrode plates. Thus, the position of the connectors may be defined in accordance with the respective lead electrodes to which the connectors are fitted.

In the EL sheet, it is desirable that the electrode plates and the connectors each are made of a metal material and the electrode plates are electromechanically bonded to the respective connectors. Also preferably, the electromechanical bonding of the electrode plates to the respective connectors is effected by soldering or metal welding.

One embodiment of the invention is described with reference to the drawings attached hereto.

DESCRIPTION OF THE PREFERRED EMBODIMENTS

Figure 1:
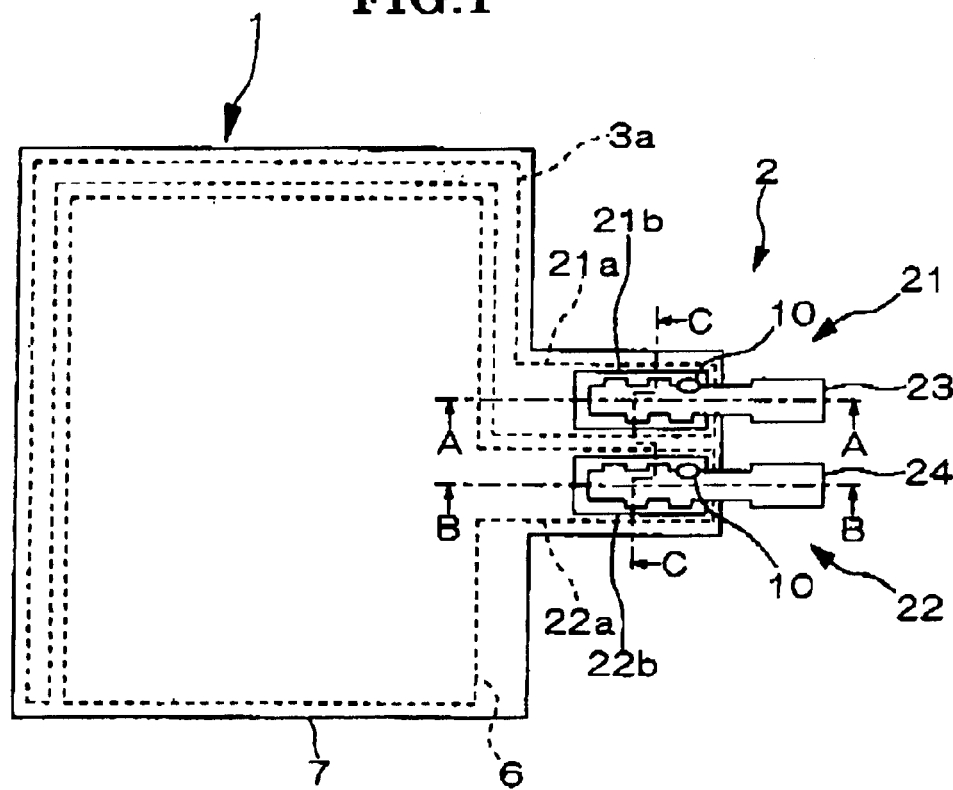
FIG. 1 is a plan view showing one embodiment of the invention.

Referring to FIG. 1, an EL sheet of the present invention comprises an EL element 1 and a lead electrode unit 2 that protrudes from the EL element 1. The lead electrode unit 2 comprises a lead electrode area 21 for a transparent electrode layer 31 (See FIG. 2) of the EL element 1 and a lead electrode area 22 for the back electrode layer thereof.

Figure 2:
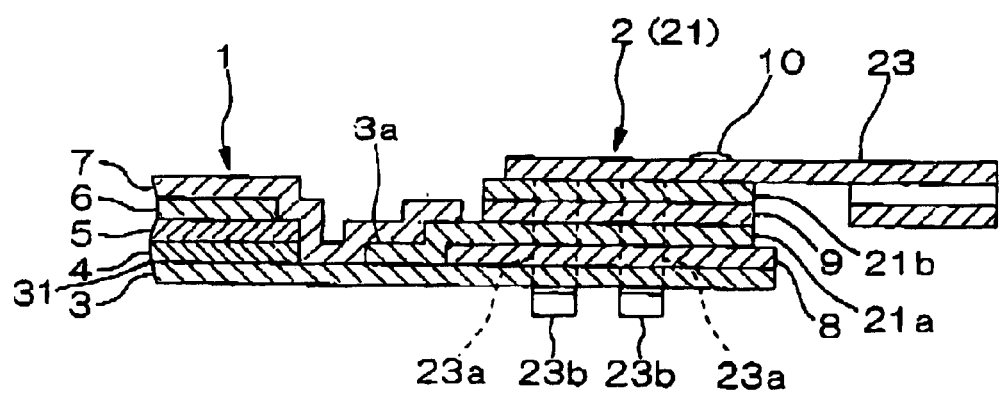
FIG. 2 is an enlarged cross-sectional view cut along line A—A of FIG. 1.
Figure 3:
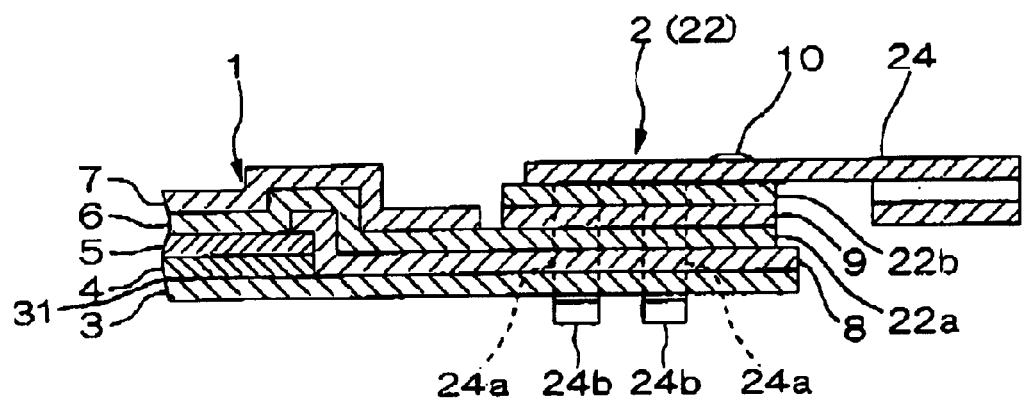
FIG. 3 is an enlarged cross-sectional view cut along line B—B of FIG. 1.

Referring to FIG. 2 and FIG. 3, the EL element 1 has a light-emitting layer 4, an insulating layer 5 and a back electrode layer 6 formed in that order on a transparent substrate 3 that has, on its face, a transparent electrode layer 31. At an outer periphery of the transparent electrode layer 31, an auxiliary electrode 3a is formed in the lead electrode area 21 for the transparent electrode layer 31. The auxiliary electrode 3a is formed of carbon or silver. Thus having such a layered structure, the top face of the EL element 1 is covered with a protective layer 7.

The transparent substrate 3 is formed of a film of polyethylene terephthalate (PET) or polycarbonate, and the transparent electrode layer 31 on it is formed through vapor deposition of indium tin oxide (hereinafter referred to as "ITO"). Alternatively, an transparent electroconductive ink paste prepared by dispersing acicular ITO crystals in resin may be applied onto the transparent substrate 3 and cured thereon to form the transparent electrode layer.

The light-emitting layer 4 is formed by printing luminescent ink on the upper face of the transparent electrode layer. For the phosphor to be in the luminescent ink, used is Cu-doped zinc sulfide (ZnS), and the phosphor is coated with a nitride. The luminescent ink is prepared by mixing such a nitride-coated phosphor with a fluororesin binder of a vinylidene fluoride-propylene hexafluoride copolymer dissolved in a solvent of methyl ethyl ketone, followed by stirring the resulting mixture. Thus prepared, the luminescent ink is printed on the face of the transparent electrode layer 31 through screen-printing or the like, and then heated and dried to form the light-emitting layer 4.

The insulating layer 5 is formed on the light-emitting layer 4. The ink to form the insulating layer 5 is prepared by mixing a ferroelectric substance of barium titanate ($BaTiO_3$) and the above-mentioned fluororesin binder followed by stirring the resulting mixture. Like that for the above-mentioned light-emitting layer 4, the ink is printed on the layer 4 to form the insulating layer 5 thereon.

The back electrode layer 6 is formed by printing carbon ink on the face of the insulating layer 5 followed by heating and drying it thereon. The carbon ink is prepared by mixing a conductor, carbon powder with a polyester resin that serves as a binder. Alternatively, the back electrode layer 6 may also be formed of an ink composition prepared by mixing carbon powder, silver powder and copper powder in a binder, polyester resin.

To construct the lead electrode structure 21 for the transparent electrode layer 31 as in FIG. 2, a resist layer 8 is formed in a predetermined site of the transparent electrode layer 31, and a lead electrode 21a for the transparent layer 31 is formed on the resist layer 8 at the same time while the auxiliary electrode 3a is formed.

To construct the lead electrode structure 22 for the back electrode layer 6 as in FIG. 3, a resist layer 8 is formed to mask the edges of the light-emitting layer 4 and the insulating layer 5, and a lead electrode 22a that runs from the back electrode layer 6 is formed at the same time while the back electrode layer 6 is formed.

After this, the protective layer 7 is formed. Any and every one of electric insulation is employable for the protective layer 7, such as polyester, polyimide, etc. It may be formed through screen-printing or the like. In the lead electrode area 21 for the transparent electrode layer 31, the protective layer 7 covers the inner end of the lead electrode 21a that runs from the transparent electrode layer 31; and in the lead electrode area 22 for the back electrode layer 6, the protective layer 7 covers the inner end of the lead electrode 22a that runs from the back electrode layer 6 (see FIG. 1).

Figure 4:
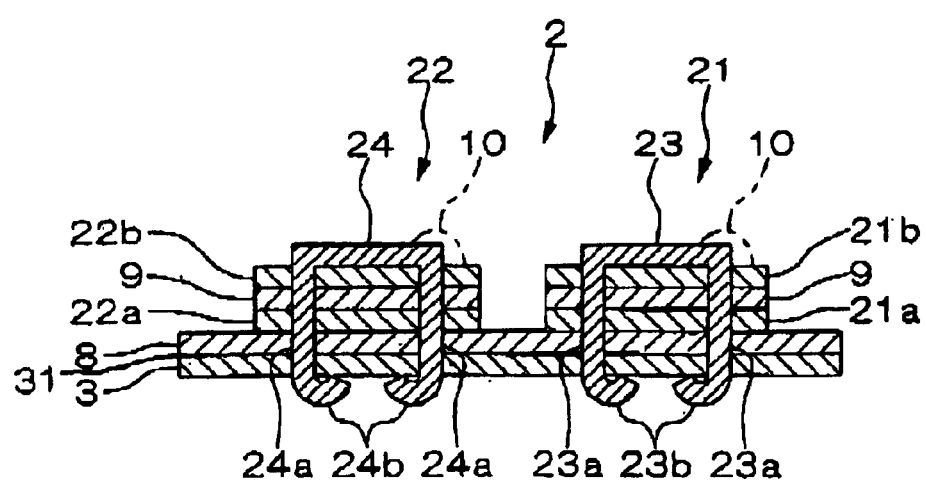
FIG. 4 is an enlarged cross-sectional view cut along line C—C of FIG. 1.

As in FIG. 2 and FIG. 3, an electroconductive adhesive 9 is applied to the exposed part of the lead electrode 21a and the lead electrode 22a each running from the transparent electrode layer and the back electrode layer, respectively, not covered with the protective layer 7, and an electrode plates 21b and 22b are put on it and adhered thereto under heat and pressure. In FIG. 4, the electroconductive adhesive 9 is separately formed on the lead electrode 21 for the transparent electrode layer 31 and on the lead electrode 22 for the back electrode layer. However, so far as the adhesive 9 is an anisotropic electroconductive adhesive, it may be continuously formed on both the two lead electrodes 21, 22 to integrate them. With that, therefore, the lead electrode 21a and the electrode plate 21b for the transparent electrode layer 31, and the lead electrode 22a and the electrode plate 22b for the back electrode layer 6 are electrically connected to each other on the entire surfaces thereof.

On the electrode plates 21b and 22b, mounted are connectors 23 and 24 to be opposite to each other, and these are electromechanically firmly bonded at their legs 23a, 24a. Specifically, the electrode plates 21b, 22b and the connectors 23, 24 each are formed of an electroconductive metal material. As in FIG. 4, the connectors 23, 24 are bent at both sides in the direction of the width thereof to form their legs 23a, 24b that are bent at an angle of 90 degrees. The legs 23a, 24a each run through the electrode plate 21b or 22b, the electroconductive adhesive 9, the lead electrode 21a or 22a, the resist layer 8 and the transparent substrate 3 that are layered in that order, and thus protrude from the back of the transparent substrate 3. The ends 23b, 24b of the thus-protruding legs are folded and caulked, whereby the connectors 23, 24 are firmly bonded to the substrate. Accordingly, the connectors 23 and 24 are kept in contact with the electrode plates 21b and 22b, respectively, on their entire surfaces, and the electric connection between the electrode plates 21b, 22b and the lead electrodes 21a, 22a is thereby stabilized and ensured. For further stabilizing the bonding connection between the electrode plates 21b, 22b and the connectors 23, 24, a solder 10 (this is shown also in FIG. 1) may be used so as to bridge and bond the two.

Figure 5:
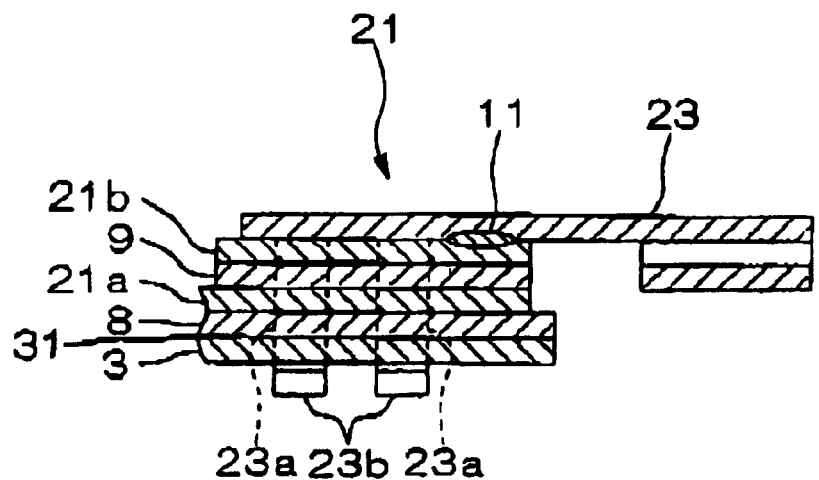
FIG. 5 is an enlarged cross-sectional view showing another embodiment of the invention.

In FIG. 2, the electrode plate 21b is bonded to the connector 23 with a solder 10 for further ensuring the electric connection of the two. The embodiment of FIG. 5 differs from this. In FIG. 5, the electrode plate 21b is bonded to the connector 23 through metallic welding to form a welded part 11 at their interface. This is also for further ensuring the electric connection of the two. Though not shown, the electrode plate 22b and the connector 24 may also be bonded to each other through metallic welding at their interface. In this, the other constitution is the same as that mentioned hereinabove, and the same reference numerals as above are given to it.

Not limited to a metal material, the electrode plates 21b, 22b may be formed of any and every electroconductive material. For example, they may be formed of electroconductive resin, etc.

If desired, the electrode plates 21b, 22b may be omitted. In case where these are omitted, the connectors 23 and 24 are bonded and fixed to the lead electrodes 21a and 22a, respectively, via the electroconductive adhesive 9 put therebetween.

Figure 6:
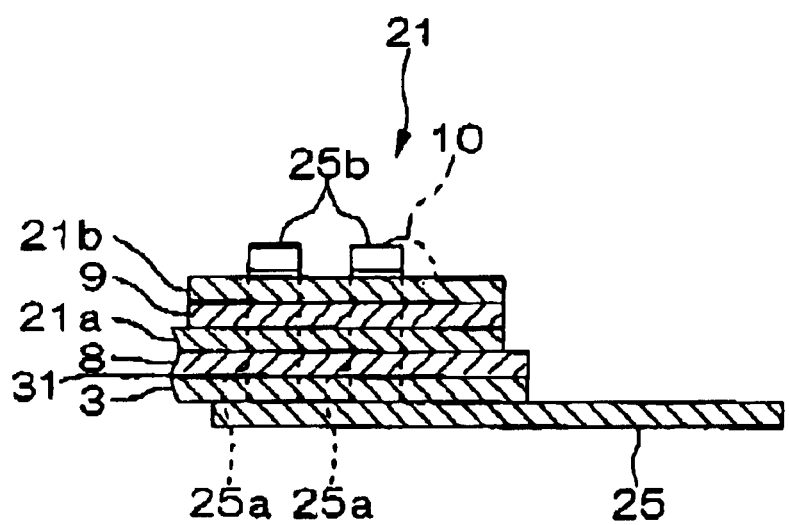
FIG. 6 is an enlarged cross-sectional view showing still another embodiment of the invention.

The connectors 23, 24 shown in FIG. 2 and FIG. 3 are both female-type ones. Contrary to these, FIG. 6 shows an embodiment of a male-type connector 25 for the lead electrode unit 21 for the transparent electrode layer. The same shall apply also to the structure of the lead electrode unit for the back electrode layer 6, and its illustration is omitted herein. As in FIG. 6, the connector 25 is provided below the transparent substrate 3, corresponding to the electrode plate 21b, and the lead electrode 21a is sandwiched between the electrode plate 21b and the connector 25. The legs 25a of the connector 25 run from the back of the transparent substrate 3, passing through the layers as above, and protrudes outside through the face of the electrode plate 21b. Their ends 25b are folded and caulked, whereby the connector 25 is firmly bonded to the substrate. The connector 25 is electrically connected to the electrode plate 21b via the end 25b of each leg 25a, and is therefore electrically connected to the lead electrode 21a. For further ensuring electric bonding and mechanical bonding of the parts, a solder 10 is used to bridge the leg end 25b and the electrode plate 21b and to bond the two.

In the EL sheet of the invention, the connectors are fixed not only with an electroconductive adhesive but also mechanically by folding their legs. Therefore, in this, the electric reliability of the lead electrodes is high, and the lead electrodes withstand exposure to high temperatures and strong external force. In addition, in the EL sheet of the invention, the electrode plates are kept in contact with the respective connectors, and the legs of every connector are folded and mechanically fixed. Therefore, in this, the electric reliability of the lead electrodes further increases. Moreover in the EL sheet of the invention, the connectors are put on the respective electrode plates so as to have the respective lead electrodes between them, and the legs of each connector formed by bending it run through the individual electrode plate and their ends are folded to thereby mechanically connect and fix the connectors to the respective electrode plates. Therefore in this, the connectors are surely electrically connected and fixed firmly to the necessary parts, and in addition, the position of the connectors may be readily defined in accordance with the respective lead electrodes to which the connectors are fitted.

What is claimed is:

1. An EL sheet comprising:

an EL element having a transparent electrode layer, a back electrode layer, a first lead electrode running from the transparent electrode layer, and a second lead electrode running from the back electrode layer;

a first connector having a body portion parallel to a plane of said EL element and first legs extending from sides of the body portion at a right angle and through the first electrode of the EL element from a first side to a second side of the EL element, and ends of the first legs bent over and caulked onto the second side of the EL element to connect the first connector to the first electrode and mechanically fix the first connector to the EL element such that the first electrode is between the body portion and the bent ends; and a second connector having a body portion parallel to a plane of said EL element and second legs extending from sides of the body portion at a right angle and through the EL element from a first side to a second side of the EL element, and ends of the second legs being bent over onto the second side of the EL element to connect the second connector to the second electrode and mechanically fix the second connector to the EL element such that the second electrode is between the body portion and the bent ends.

2. An EL sheet comprising:

an EL element having a transparent electrode layer, a back electrode layer, a first lead electrode running from the transparent electrode layer, and a second lead electrode running from the back electrode layer;

a first electrode plate fixed to the first lead electrode;

a second electrode plate fixed to the second lead electrode;

a first connector having a body portion disposed on the first electrode plate;

the first connector having the body portion parallel to a plane of said EL element and first legs extending from sides of the body portion at a right angle and through the EL element from a first side to a second side of the EL element, and ends of the first legs bent over and caulked onto the second side of the EL element to connect the first connector to the first electrode and mechanically fix the first connector to the EL element such that the first electrode is between the body portion and the bent ends;

a second connector having a body portion disposed on the second electrode plate; and the second connector having the body portion parallel to a plane of said EL element and second legs extending from sides of the body portion at a right angle and through the EL element from a first side to a second side of the EL element, and ends of the second legs being bent over and caulked onto the second side of the EL element to connect the second connector to the second electrode and mechanically fix the second connector to the EL element such that the second electrode is between the body portion and the bent ends.

3. An EL sheet comprising:

an EL element having a transparent electrode layer, a back electrode layer, a first lead electrode running from the transparent electrode layer, and a second lead electrode running from the back electrode layer;

a first electrode plate fixed to the first lead electrode on a first side of the EL element;

a second electrode plate fixed to the second lead electrode on the first side of the EL element;

a first connector having a body portion disposed on a second side of the EL element such that the EL element is between the body portion and the first electrode plate;

the first connector having the body portion parallel to a plane of said EL element and first legs extending from sides of the body portion at a right angle and through the EL element and the first electrode plate from the second side to the first side of the EL element, and ends of the first legs bent over and caulked onto the first electrode plate to connect the first connector to the first electrode and mechanically fix the first connector to the EL element such that the first electrode is between the body portion and the bent ends;

a second connector having a body portion disposed on a second side of the EL element such that the EL element is between the body portion and the second electrode plate;

the second connector having the body portion parallel to a plane of said EL element and second legs extending from sides of the body portion at a right angle and through the EL element and the second electrode plate from the second side to the first side of the EL element, and ends of the second legs bent over and caulked onto the second electrode plate to connect the second connector to the second electrode and mechanically fix the first connector to the EL element such that the second electrode is between the body portion and the bent ends.

4. The EL sheet as claimed in claim 2 or 3, wherein the first and second electrode plates and the first and second connectors each are made of a metal material, and the first and second electrode plates are respectively electromechanically bonded to the first and second connectors.

5. The EL sheet as claimed in claim 4, wherein the electromechanical bonding of the first and second electrode plates to the first and second connectors is effected by soldering or metal welding.

* * * * *